United States Patent
Korol et al.

(10) Patent No.: US 10,404,216 B2
(45) Date of Patent: Sep. 3, 2019

(54) RF AMPLIFIER LINEARITY ENHANCEMENT WITH DYNAMICALLY ADJUSTED VARIABLE LOAD

(71) Applicant: Integrated Device Technology, Inc., San Jose, CA (US)

(72) Inventors: Victor Korol, San Diego, CA (US); Roberto Aparicio Joo, San Diego, CA (US); Mohsin Asif, Somerville, MA (US); Shawn Bawell, Amherst, NH (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/887,013

(22) Filed: Feb. 2, 2018

(65) Prior Publication Data
US 2019/0068121 A1 Feb. 28, 2019

Related U.S. Application Data

(60) Provisional application No. 62/550,807, filed on Aug. 28, 2017.

(51) Int. Cl.
*H03F 1/02* (2006.01)
*H03F 3/19* (2006.01)

(52) U.S. Cl.
CPC ............. *H03F 1/0205* (2013.01); *H03F 3/19* (2013.01); *H03F 2200/411* (2013.01); *H03F 2200/451* (2013.01)

(58) Field of Classification Search
CPC ..................................................... H03F 1/0205
See application file for complete search history.

(56) References Cited

U.S. PATENT DOCUMENTS

| | | | | |
|---|---|---|---|---|
| 3,546,612 A | * | 12/1970 | Day | G01D 3/021 324/71.1 |
| 7,170,341 B2 | * | 1/2007 | Conrad | H03F 1/02 330/296 |
| 7,202,736 B1 | * | 4/2007 | Dow | H03F 1/14 330/129 |
| 8,452,243 B2 | * | 5/2013 | Prikhodko | G01R 31/2837 455/107 |
| 2012/0013401 A1 | * | 1/2012 | Jeon | H03F 1/02 330/192 |

* cited by examiner

*Primary Examiner* — Patricia T Nguyen
(74) *Attorney, Agent, or Firm* — Christopher P. Maiorana, PC

(57) ABSTRACT

An apparatus comprises an amplifier having a predefined linear range and a shunt load. The shunt load may be connected to an output, an input, or between gain stages of the amplifier. An impedance of the shunt load dynamically varies in response to a level of a signal presented at a node formed by interconnection of the shunt load and the amplifier, extending linearity of the amplifier beyond the predefined range.

19 Claims, 5 Drawing Sheets

RF AMPLIFIER LINEARITY ENHANCEMENT WITH DYNAMICALLY ADJUSTED VARIABLE LOAD

This application relates to U.S. Provisional Application No. 62/550,807, filed Aug. 28, 2017, which is hereby incorporated by reference in its entirety.

FIELD OF THE INVENTION

The invention relates to amplifiers generally and, more particularly, to a method and/or apparatus for implementing RF amplifier linearity enhancement with a dynamically adjusted variable load.

BACKGROUND

An amplifier is an electronic circuit used to increase a level or power of an input signal. A linear amplifier produces an output signal that is proportional to the input signal, but capable of delivering more power into a load. Linear amplifiers are typically used in radio frequency (RF) communications applications. In a communications system, amplifier linearity is important to minimize distortion in the output signal. Conventional amplifiers have a limited range of input levels where the output level is linearly related to the input level. When an upper level of the linear range is exceeded, the amplifiers begin to compress the output signal, resulting in distortion.

It would be desirable to implement RF amplifier linearity enhancement with a dynamically adjusted variable load.

SUMMARY

The invention concerns an apparatus comprising an amplifier having a predefined linear range and a shunt load. The shunt load may be connected to an output, an input, or between gain stages of the amplifier. An impedance of the shunt load dynamically varies in response to a level of a signal presented at a node formed by interconnection of the shunt load and the amplifier, extending linearity of the amplifier beyond the predefined range.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing RF amplifier linearity enhancement with a dynamically adjusted variable load that may (i) be applied to any amplifier, (ii) utilize a nonlinear transconductor, (iii) be programmable to facilitate production tuning, (iv) be implemented in multi-stage amplifiers, (v) be implemented using a variety of semiconductor technologies, and/or (vi) be implemented as one or more integrated circuits.

Figure 1:
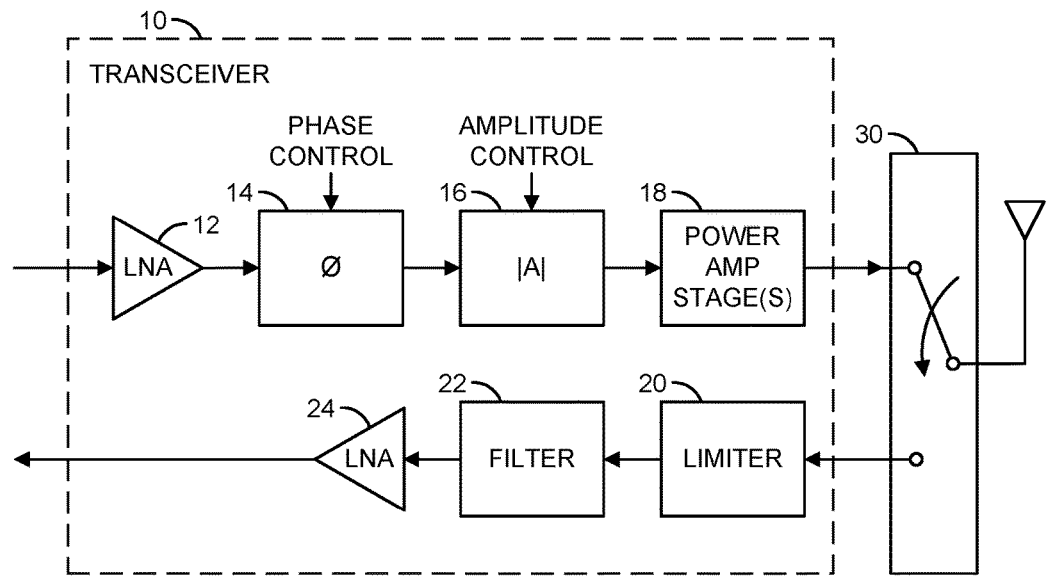
FIG. 1 is a diagram illustrating a typical RF amplifier application.

Referring to FIG. 1, a block diagram of a transceiver circuit 10 is shown illustrating a typical radio frequency (RF) amplifier application. In an example embodiment, the circuit 10 may implement a transceiver. A transceiver is capable of both transmitting and receiving signals of a communication channel. In various embodiments, the circuit 10 may be capable of transmitting and receiving radio frequency (RF), microwave, and/or millimeter-wave signals. In various embodiments, the circuit 10 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 10 may be representative of a radar application including, but not limited to target detection, ranging, and/or through-wall imaging.

In an example, the transceiver circuit 10 generally comprises both a transmitter chain and a receiver chain. Both the transmitter chain and the receiver chain may comprise radio frequency (RF) amplifiers. In an example, the transmitter chain may include an input amplifier 12, a variable phase shifter 14, a variable attenuator 16, and one or more output amplifier stages 18. In an example, the input amplifier 12 may be implemented as a low noise amplifier (LNA). The output amplifier stages 18 may include drivers, pre-amplifiers, and/or power amplifiers. In an example, the receiver chain may include a limiter (or protection) circuit 20, a filter 22, and a low noise amplifier (LNA) 24. In an example, an output of the transmitter chain and an input of the receiver chain may be coupled to a transmission line or an antenna by an RF switch 30. In various embodiments, amplifier linearity enhancement with a dynamically variable load in accordance with an example embodiment of the invention may be implemented in connection with any or all of the amplifiers in the transceiver circuit 10.

Figure 2:
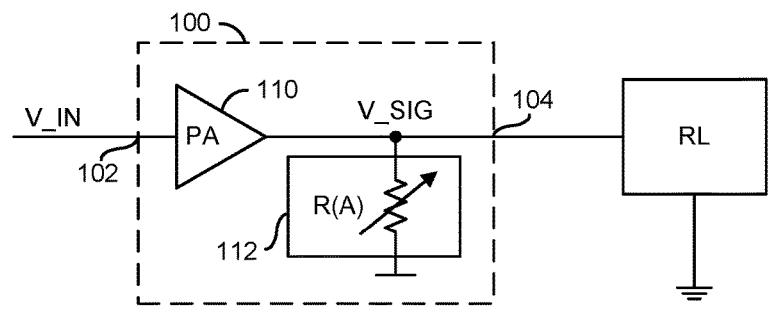
FIG. 2 is a diagram illustrating an amplifier circuit in accordance with an example embodiment of the invention.

Referring to FIG. 2, a diagram of a circuit 100 is shown illustrating an amplifier implementing a dynamically adjusted variable load in accordance with an example embodiment of the invention. In an example, the circuit 100 may have an input 102 that may receive a signal (e.g., V_IN) and an output 104 that may present a signal (e.g., V_SIG). In an example, the output 104 of the amplifier circuit 100 may be coupled to a load resistance RL. A relationship between the signal V_SIG appearing across the load resistance RL and the signal V_IN presented to the input 102 of the amplifier circuit 100 is generally referred to as a gain (G) of the amplifier circuit 100.

In an example, the amplifier circuit 100 may comprise a power amplifier (PA) 110 and a dynamically variable load 112. However, other types of amplifiers may be implemented accordingly to meet the design criteria of a particular application. In various embodiments, the dynamically variable load 112 may comprise a resistance having a dynamic dependence (e.g., R(A)) on a voltage amplitude (e.g., A) of the signal V_SIG across the terminals of the dynamically variable load 112. In an example, the resistance R(A) may be constant at amplitudes of V_SIG less than or equal to a first predefined value (e.g., A1) and may dynamically adjust (e.g., gradually increase) for amplitudes of V_SIG>A1. The dynamic resistance profile R(A) in combination with the load resistance RL generally presents a constant shunt load to the amplifier 110 at V_SIG≤A1 and dynamically reduces the shunt load presented to the amplifier 110 for V_SIG>A1. Reducing the loading of the amplifier 110 for V_SIG>A1 generally extends a linear power range of the amplifier 110.

Figure 3:
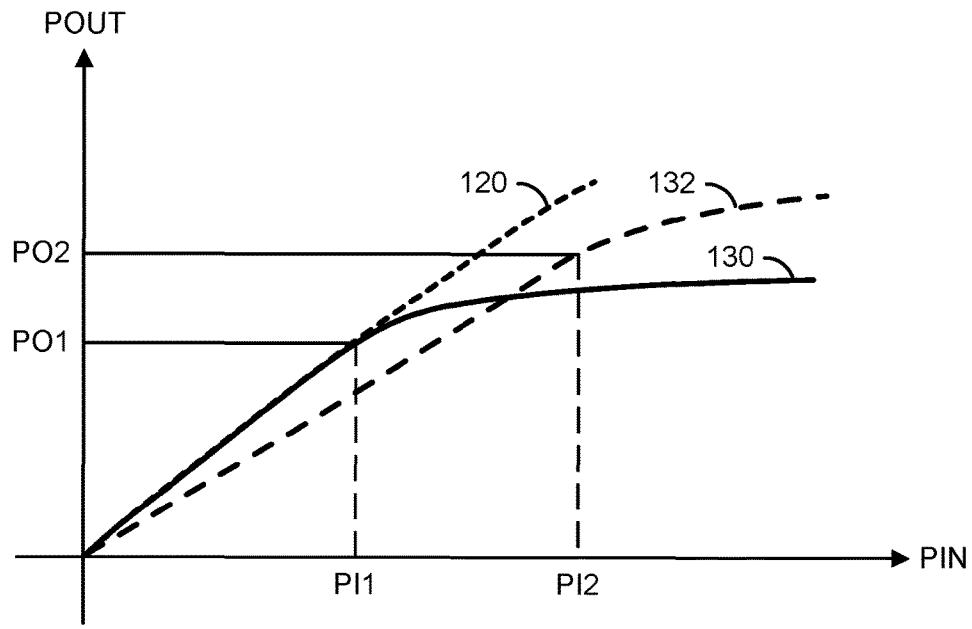
FIG. 3 is a diagram illustrating amplifier gain dependence in various contexts.

Referring to FIG. 3, a diagram is shown illustrating amplifier gain dependence in various contexts. In an example, an ideal linear gain 120 is generally denoted by a short-dashed line. A solid line shows a typical amplifier Pout(Pin) dependence, or gain 130. In the amplifier Pout (Pin) dependence, there is a linear gain dependence from a small signal input swing up to an input power magnitude PI1. Above the input power magnitude PI1, the amplifier gain 130 is gradually compressed, departing from the ideal linear gain 120.

In an amplifier implementing a dynamically variable load in accordance with an example embodiment of the invention, an extended linear gain dependence 132 (illustrated by a long-dash line) may be obtained by correcting the compression of the amplifier. In various embodiments, a nonlinear dynamic resistance may be utilized to achieve the corrective amplifier gain boosting. The correction may be achieved by reducing the linear gain of the amplifier in the linear region, and then adding extra signal gain at the compression region (e.g., corresponding to input power magnitude exceeding PI1). The extra signal gain allows the linear gain range to be extended from input power level PI1 to a greater input power level (e.g., PI2). The extra signal gain also allows the amplifier to achieve a corresponding increase of the linear output power range of the amplifier (e.g., from an output power level PO1 to an output power level PO2).

Figure 4:
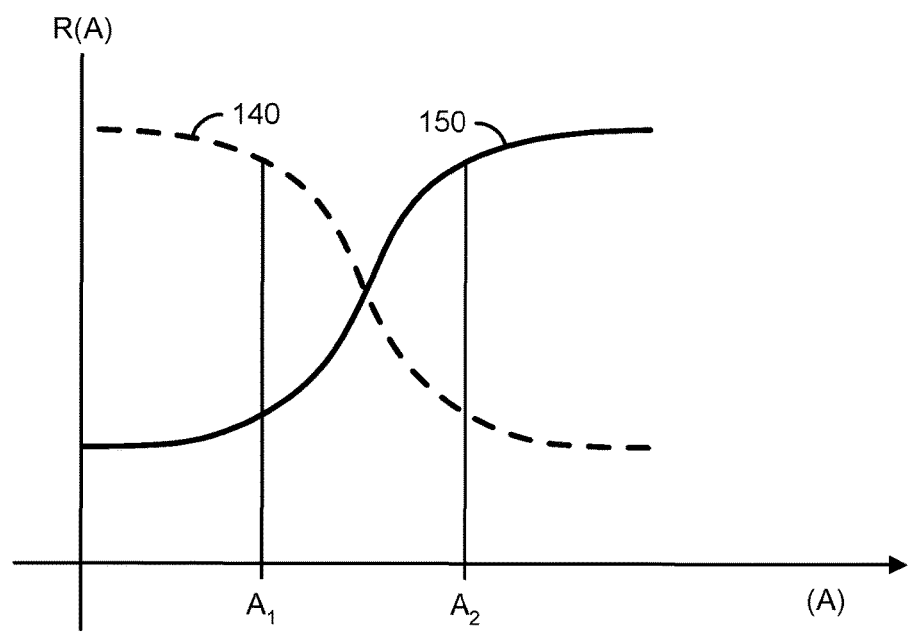
FIG. 4 is a diagram illustrating an example of a dynamically adjusted amplifier load resistance in accordance with an example embodiment of the invention.

Referring to FIG. 4, a diagram is shown illustrating an example of a dynamically variable load resistance in accordance with an example embodiment of the invention. In an example, a long-dashed line 140 illustrates a combined shunt load provided by the dynamically variable load 112 and the load resistance RL connected to the output 104 of the amplifier 100. The value of the variable load 112 (illustrated by solid line 150) has a dynamic dependence R(A) on the signal voltage amplitude (e.g. A) of the signal V_SIG across the terminals of the dynamically variable load 112. The resistance R(A) is generally constant at amplitudes of V_SIG less than or equal to a first predefined value (e.g., V_SIG≤A1) and may dynamically adjust (e.g., gradually increase) for amplitudes of V_SIG greater than the first predefined value (e.g., V_SIG>A1). Such a dynamic resistance profile presents a constant shunt load to the amplifier 102 at V_SIG≤A1 and dynamically reduces the shunt load for amplitudes of V_SIG>A1. Reducing the loading of the amplifier 102 generally constitutes a gain boost that extends the linear power range of the amplifier 102. In an example, the dynamically adjusted variable load may decrease or stop the gain correction load adjustment due to diminishing linearity correction benefit at a high compression (or saturation) signal level (e.g., A2).

Figure 5:
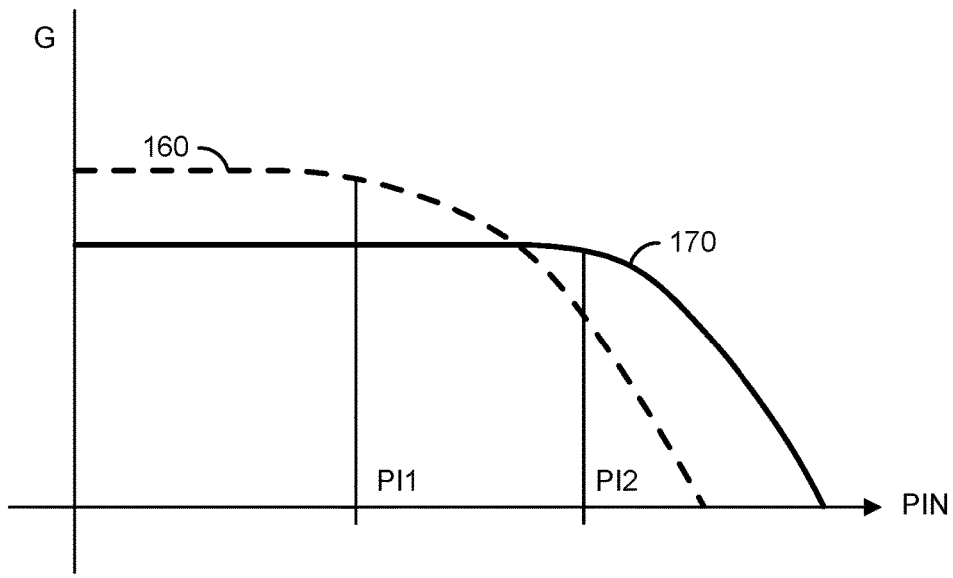
FIG. 5 is a diagram illustrating amplifier gain as a function of input power.

Referring to FIG. 5, a diagram is shown illustrating amplifier gain as a function of input power (PIN). Applying dynamic gain correction delays amplifier compression, extending the linear operating range of the amplifier. The linear gain range extension be seen by comparing a typical input power range (e.g., curve 160) to an input power range extended in accordance with an example embodiment of the invention (e.g., curve 170). In an example, applying dynamic gain correction in accordance with an example embodiment of the invention may extend the linear gain range of an amplifier from an input power level PI1 to a higher input power level PI2.

Figure 6:
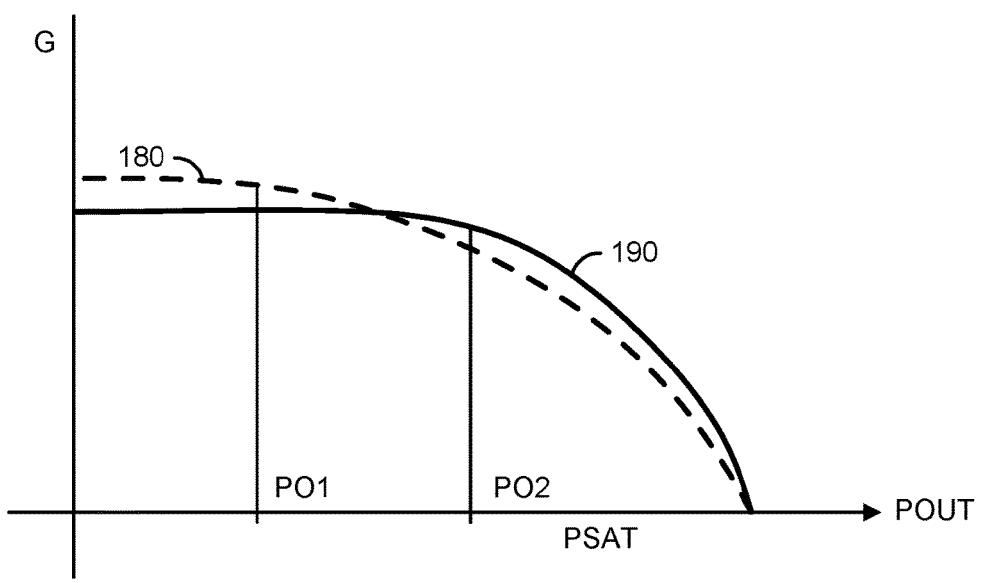
FIG. 6 is a diagram illustrating amplifier gain as a function of output power.

Referring to FIG. 6, a diagram is shown illustrating amplifier gain as a function of output power (POUT). Applying dynamic gain correction delays amplifier compression, extending the linear operating range of the amplifier. The linear gain range extension is generally illustrated as a linear output power range extension from a typical output power range (e.g., curve 180) to an output power range extended in accordance with an example embodiment of the invention (e.g., curve 190). In an example, by applying dynamic gain correction the saturation power of an amplifier (e.g., Psat) may be extended from an output power level PO1 to a higher output power level PO2. Psat is the maximum output power level of the power amplifier. Psat is reached when increasing the input power to the power amplifier results in minimal or no increase in the power amplifier output power level.

Figure 7:
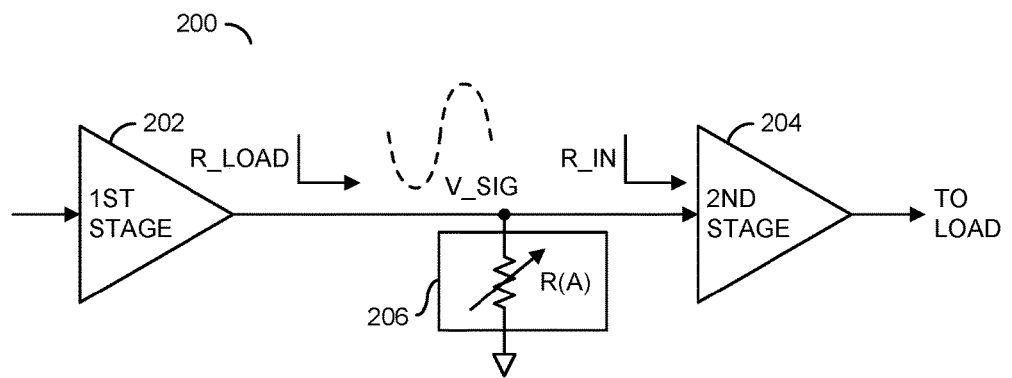
FIG. 7 is a diagram illustrating an amplifier circuit in accordance with another example embodiment of the invention.

Referring to FIG. 7, a diagram of a circuit 200 is shown illustrating an amplifier circuit in accordance with another example embodiment of the invention. In an example, the amplifier circuit 200 may comprise a first amplifier stage 202, a second amplifier stage 204, and dynamically variable resistance 206. In an example, the first amplifier stage 202 generally implements a pre-amplifier stage. The second stage 204 generally implements a power amplifier (PA) or driver stage.

A linear range of the amplifier circuit 200 may be extended using the dynamically variable resistance 206. In an embodiment implementing a two stage amplifier, the dynamically variable resistance 206 may be placed between the first amplifier stage 202 and the second amplifier stage 204 of the amplifier circuit 200. The dynamically variable resistance 206 is generally configured to provide a nonlinear resistance to compensate for gain compression. In general, the second amplifier stage 204 starts to compress first.

Figure 8:
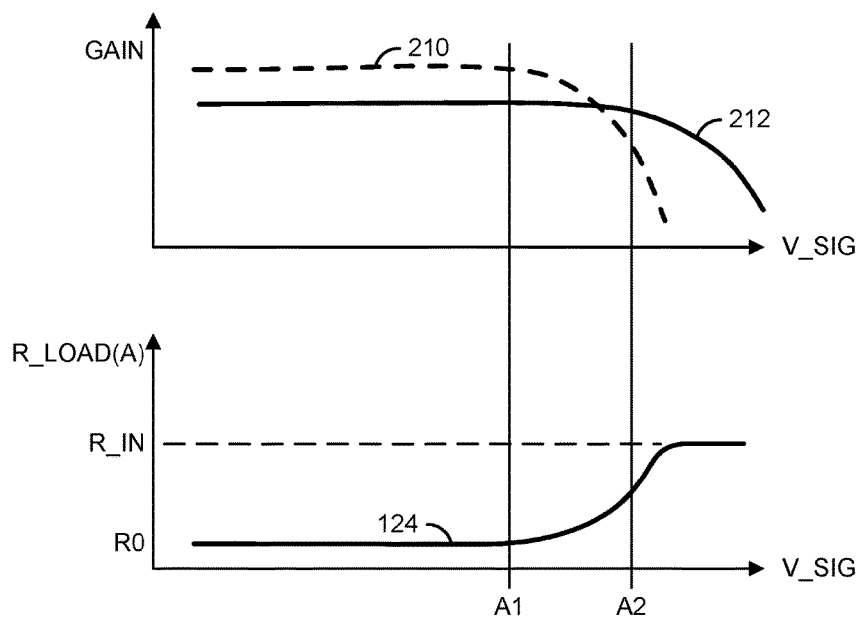
FIG. 8 is a diagram illustrating gain and dynamic load resistance as functions of signal level.

When the amplitude of the signal V_SIG rises above a predefined level (e.g., A1), the second amplifier stage 204 generally enters compression. Simultaneously, a value (e.g. R(A)) of the dynamically variable resistance 206 begins increasing, as illustrated in FIG. 8. In general, the load (e.g., R_LOAD) presented to the first amplifier stage 202 may be expressed by the following Equation 1:

$$R\_LOAD = R\_IN \| R(A), \qquad \text{EQ. 1}$$

where R_IN represents the load presented looking into the second amplifier stage 204. The value R_LOAD is generally also increasing, causing an increase of the voltage gain of the first amplifier stage 202. The increase in voltage gain of the first amplifier stage 202 caused by the dynamically variable resistance 206 generally offsets the compression of the second amplifier stage 204 and improves the overall linear gain range of the amplifier 200, as can be seen by comparing lines 210 and 212 in FIG. 8.

Referring to FIG. 8, a diagram is shown illustrating gain and dynamic load resistance as functions of signal level. When the amplitude of the signal V_SIG across the dynamically variable resistance 206 is below a predefined value (e.g., A1), the dynamic resistance R(A) remains at a constant value (e.g. R0). When the amplitude of the signal V_SIG across the dynamically variable resistance 206 rises above the predefined value A1, the dynamic resistance R(A) starts increasing, driving the load impedance (e.g., R_LOAD(A)) of the first amplifier stage 202 toward the value of the input impedance (e.g., R_IN) of the second amplifier stage 204 (as illustrated by the line 124). The value R_LOAD(A) may be represented by the following Equation 2:

$$R\_LOAD(A)=R\_IN \| R(A) \qquad \text{EQ. 2}$$

where R_IN represents the load presented looking into the second amplifier stage 204. The value R_LOAD(A) is generally also increasing, causing an increase of the voltage gain of the first amplifier stage 202. The increasing value of R_LOAD(A) results in an increase in the voltage gain of the first amplifier stage 202, which offsets the compression of the second amplifier stage 204 and improves the overall amplifier linear gain range from the signal amplitude value A1 to the signal amplitude value A2, as illustrated by the line 212.

Figure 9:
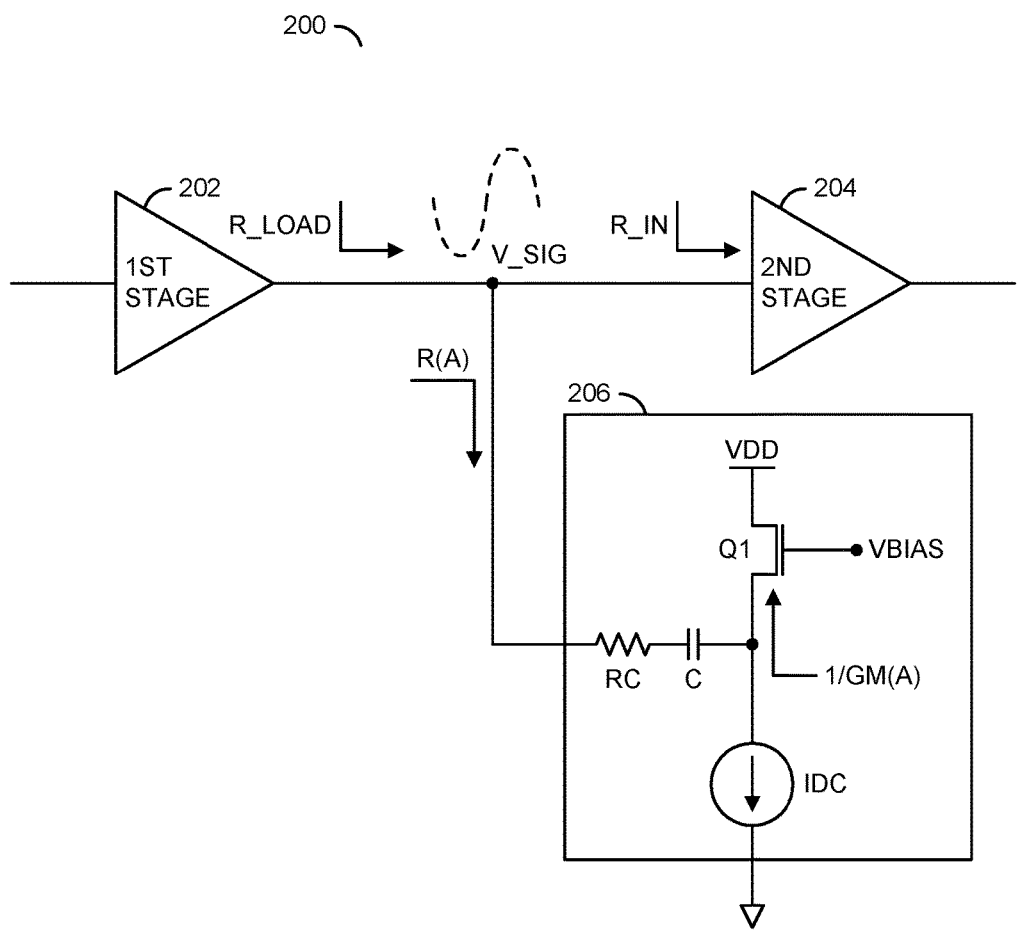
FIG. 9 is a diagram illustrating an example implementation of a dynamically adjusted load resistance circuit in accordance with another example embodiment of the invention.

Referring to FIG. 9, a diagram is shown illustrating an example implementation of the dynamically variable load resistance circuit 206 in accordance with another example embodiment of the invention. In an example, the dynamically variable load resistance circuit 206 may be implemented using a fixed value resistor RC, a fixed value capacitor C, a constant current source IDC, and a transistor Q1. The resistor RC and capacitor C are connected in series. A source of the transistor Q1 is coupled to (i) the constant current source IDC and (ii) the output of the first amplifier stage 202 (and also the input of the second amplifier stage 204) through the series connected resistor and capacitor. A drain of the transistor Q1 may be connected to a supply voltage (e.g., VDD). A gate of the transistor Q1 is biased by a bias voltage (e.g., VBIAS). The source impedance of Q1 (e.g., 1/gm(A)) generally implements the dynamically variable resistance R(A). The bias voltage VBIAS and the bias current provided by the constant current source IDC are generally chosen to meet linearization criteria of a particular implementation. In an example, a higher bias current will generally correspond to a lower value of R0 and a lower slope of the dynamically variable resistance R(A) in the input signal amplitude region between A1 and A2 boundaries.

The fixed value resistor RC may be used to set the small signal load resistance R0. Together, sizing of the transistor Q1, bias current IDC, value of the fixed value resistor RC and coupling capacitor C may allow precise definition of the different regions and/or shape of the equivalent dynamically variable load resistance R(A) illustrated as the curve 124 in FIG. 8. The equivalent dynamically variable load resistance R(A) may be shaped so as to cause gain expansion of the first amplifier stage 202 which will inversely match and offset the gain compression of the second amplifier stage 204, and extend the overall amplifier linear gain range of the amplifier 200.

The transistor Q1 is generally implemented using a technology (e.g., BJT, MOSFET, pHEMT, etc.) similar to the technology of the amplifier circuit 200. In some embodiments, the transistor Q1 may be external to the amplifier 200. In some embodiments, the transistor Q1 may be implemented on the same substrate with the amplifier 200 in order to track variations in process, voltage, and/or temperature (PVT) corners. A larger Q1 may improve repeatability over process variation, but necessitates inclusion of RC. Depending on the size of Q1, the resistor RC may be omitted. In some embodiments, the dynamically variable resistance may be programmable (e.g., through options, laser trimming, etc.) to facilitate production tuning/calibration.

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:
1. An apparatus comprising:
an amplifier having a predefined linear range; and
a shunt load circuit connected to an output, an input, or between gain stages of said amplifier, wherein the shunt load circuit sets a predefined load resistance level when a level of a signal presented at a node formed by interconnection of the shunt load circuit and the amplifier is below a predefined value and dynamically varies the load resistance level in response to said level of said signal presented at said node formed by interconnection of the shunt load circuit and the amplifier rising above the predefined value, extending linearity of the amplifier beyond the predefined range.

2. The apparatus according to claim 1, wherein said shunt load circuit comprises a fixed resistance and a dynamically variable resistance.

3. The apparatus according to claim 2, wherein said dynamically variable resistance is configured to provide a first resistance value when said level of said signal is within said predefined linear range of said amplifier and dynamically vary toward a second resistance value when said level of said signal exceeds said predefined linear range of said amplifier.

4. The apparatus according to claim 2, wherein said dynamically variable resistance varies nonlinearly in response to said level of said signal when said level of said signal exceeds said predefined linear range of said amplifier.

5. The apparatus according to claim 4, wherein said nonlinear variation in said dynamically variable resistance counteracts a nonlinear response of said amplifier to an input signal exceeding said predefined linear range of said amplifier.

6. The apparatus according to claim 2, wherein said dynamically variable resistance varies linearly in response to said level of said signal when said level of said signal exceeds said predefined linear range of said amplifier.

7. The apparatus according to claim 6, wherein said linear variation in said dynamically variable resistance counteracts a response of said amplifier to an input signal exceeding said predefined linear range of said amplifier.

8. The apparatus according to claim 1, wherein said amplifier comprises a radio frequency amplifier.

9. The apparatus according to claim 1, wherein:
said amplifier comprises a first amplifier stage connected to a second amplifier stage; and
said shunt load circuit is connected between said first and said second amplifier stages.

10. The apparatus according to claim 1, wherein said shunt load circuit comprises a transistor connected in series with a constant current source and a node formed by connection of said transistor and said constant current source is coupled to said output or said input of said amplifier or said gain stages by a capacitor.

11. The apparatus according to claim 1, wherein said shunt load circuit comprises a transistor connected in series with a constant current source and a node formed by connection of said transistor and said constant current source is coupled to said output or said input of said amplifier or said gain stages by a capacitor in series with a fixed value resistor.

12. A method of extending amplifier gain linearity comprising:
coupling a shunt load circuit to an output or an input of an amplifier stage, said amplifier having a predefined linear range;
maintaining a load resistance level of said shunt load circuit at a first value when a level of a signal at a node formed by interconnection of said shunt load circuit and said amplifier is within said predefined linear range of said amplifier; and
dynamically varying said load resistance level of said shunt load toward a second value when said level of said signal at said node exceeds said predefined linear range of said amplifier.

13. The method according to claim 12, wherein said shunt load circuit comprises a fixed resistance and a dynamically variable resistance.

14. The method according to claim 13, wherein said dynamically variable resistance varies nonlinearly in response to said level of said signal when said level of said signal exceeds said predefined linear range of said amplifier.

15. The method according to claim 14, wherein said nonlinear variation in said dynamically variable resistance counteracts a nonlinear response of said amplifier to an input signal exceeding said predefined linear range of said amplifier.

16. The method according to claim 13, wherein said dynamically variable resistance varies linearly in response to said level of said signal when said level of said signal exceeds said predefined linear range of said amplifier.

17. The method according to claim 12, wherein said shunt load circuit comprises a transistor connected in series with a constant current source and a node formed by connection of said transistor and said constant current source is coupled to said output or said input of said amplifier stage by a capacitor.

18. The method according to claim 12, wherein said shunt load circuit comprises a transistor connected in series with a constant current source and a node formed by connection of said transistor and said constant current source is coupled to said output or said input of said amplifier stage by a capacitor in series with a fixed value resistor.

19. The method according to claim 18, wherein said fixed value resistor determines said first value of said load resistance level of said shunt load circuit when said level of said signal at said node formed by interconnection of said shunt load circuit and said amplifier is within said predefined linear range of said amplifier.

* * * * *